United States Patent [19]
Yoshida et al.

[11] Patent Number: 5,136,289
[45] Date of Patent: Aug. 4, 1992

[54] DICTIONARY SEARCHING SYSTEM

[75] Inventors: Shigeru Yoshida, Ebina; Yasuhiko Nakano, Atsugi; Yoshiyuki Okada, Isehara; Hirotaka Chiba, Atsugi, all of Japan

[73] Assignee: Fujitsu Limited, Kawaski, Japan

[21] Appl. No.: 740,912

[22] Filed: Aug. 6, 1991

[30] Foreign Application Priority Data

Aug. 6, 1990 [JP] Japan .................................. 2-209566
Aug. 8, 1990 [JP] Japan .................................. 2-211295

[51] Int. Cl.$^5$ .............................................. H03M 7/40
[52] U.S. Cl. .......................................... 341/67; 341/51
[58] Field of Search ............................... 341/51, 65, 67

[56] References Cited

U.S. PATENT DOCUMENTS

| | | | |
|---|---|---|---|
| 4,558,302 | 12/1985 | Welch | 341/67 |
| 4,701,745 | 10/1987 | Waterworth | 341/63 |
| 4,814,746 | 3/1989 | Miller et al. | 341/95 |
| 4,876,541 | 10/1989 | Storer | 341/51 |
| 4,881,075 | 11/1989 | Weng | 341/87 |
| 5,049,881 | 9/1991 | Gibson et al. | 341/95 |
| 5,058,137 | 10/1991 | Shah | 375/94 |

OTHER PUBLICATIONS

T. C. Bell et al., "Text Compression", Prentice Hall, Inc. 1990.
T. C. Bell et al., "Modeling for Text Compression", ACM Computing Surveys, vol. 21, No. 4, Dec. 1989.
T. C. Bell, "Better OPM/L Text Compression", IEEE Transactions on Communications, vol. COM-34, No. 12, Dec. 1986.
S. Munakata, "Ziv-Lempel Data Compression Algorithms", Information Processing, vol. 26, No. 1.
T. A. Welch, "A Technique for High-Preformance Data Compression", Computer, Jun. 1984.
D. A. Lelewer et al., "Data Compression", ACM Computing Surveys, vol. 19, No. 3, Sep. 1987.

Primary Examiner—A. D. Pellinen
Assistant Examiner—Marc S. Hoff
Attorney, Agent, or Firm—Staas & Halsey

[57] ABSTRACT

A dictionary searching system retrieves a character string which is described by input reference number and characters from a plurality of mutually different character strings which are registered in a dictionary in correspondence with reference numbers assigned to the character strings. The dictionary searching system includes a dictionary which is made up of an index part for storing in correspondence with the reference numbers a reference number which is assigned to one of character strings which are obtained by adding a character to the character string which is assigned the input reference number and the character which is added to the one of the character strings and a list part for storing in correspondence with the reference numbers a reference number which is assigned to one of character strings having a last character which differs from that of the character string which is assigned the input reference number and the character which is added to the one of the character strings, a reading part for initially reading information from the index part by specifying the input reference number and thereafter reading information from the list part by specifying the reference number which is read from the dictionary, a detecting part for detecting each character which matches the input characters out of characters read from the dictionary and for outputting a result of this detection as a retrieval result, and a deciding part for deciding whether or not a reference number is included in an output of the dictionary and for outputting a result of this detection as a retrieval result, where the reading part, the detecting part and the deciding part operate independently of each other.

11 Claims, 9 Drawing Sheets

FIG.1A $$\frac{a\ b\ a\ b\ c\ b\ a\ b\ b\ a\ a\ a}{1\ 2\ 4\ 3\ 5\ 8\ 1\ 10}\ ---$$

FIG.1B $$\frac{a\ b\ a}{4}\ \frac{b\ c}{6}\ \frac{b\ a}{8}\ \frac{b}{} \ \frac{a\ a}{10}\ ---$$

FIG.1C $$\frac{b\ a}{5}\ \frac{c\ b}{7}\ \frac{b\ a\ b\ a}{9}\ ---$$

LIST PART

| POINTER PART | FLAG PART | ID INFO PART | | | |
|---|---|---|---|---|---|
| | | REF NO PART(1) | REF NO PART(2) | CHARACTER PART (1) | CHARACTER PART (2) |
| | | ω1 | ω2 | K1 | K2 |
| | | | | | |
| | | | | | |
| | | | | | |

| POINTER PART | FLAG PART | ID INFO PART | | | |
|---|---|---|---|---|---|
| | | REF NO PART(1) | REF NO PART(2) | CHARACTER PART (1) | CHARACTER PART (2) |
| | | ω3 | ω4 | K3 | K4 |
| | | | | | |
| | | | | | |
| | | | | | |

DICTIONARY SEARCHING SYSTEM

BACKGROUND OF THE INVENTION

The present invention generally relates to dictionary searching systems, and more particularly to a dictionary searching system which is used for a universal coding such as an incremental parsing type Ziv-Lempel coding.

Recently, various kinds of data including character codes, vector information and image information have been processed in a computer, and the quantity of the data which is processed is rapidly increasing.

When storing and transmitting such a large quantity of data, it is desirable to compress the data quantity by omitting redundant parts of the data. For this reason, there is a demand to realize a method of efficiently compressing the data regardless of the kind of data.

Universal coding does not require a predetermined code table to be prepared in advance. Hence, universal coding may be applied to the compression of the various kinds of data described above.

In this specification, the data amounting to one word will be referred to as a "character", and the data corresponding to a plurality of consecutive words will be referred to as a "character string".

The Ziv-Lempel coding is a typical universal coding described in Seiji Munakata, "Ziv-Lempel Data Compression Algorithms", Information Processing, Vol. 26, No. 1, 1985, for example, and universal type and incremental parsing type algorithms have been proposed. In addition, an LZSS coding has also been proposed as a modification of the universal type algorithm and is described in Timothy C. Bell, "Better OPM/L Text Compression", IEEE Transactions on Communications, Vol.COM-34, No.12, Dec. 1986. Furthermore, an LZW coding has been proposed as a modification of the incremental parsing type algorithm and is described in Terry A. Welch, "A Technique for High-Performance Data Compression", Computer, Jun. 1984.

Out of the coding techniques described above, the LZW coding is employed in file compression for storage devices and the like because a high-speed processing can be carried out and the LZW coding algorithm is simple.

According to the incremental parsing type algorithm, an input character string is decomposed into string components which are respectively formed by adding an extension character to a partial string which is already registered in a dictionary. The input character string is coded by describing the string components by a reference number corresponding to one partial string which is registered in the dictionary and an extension character. The string component described above is registered in the dictionary as a new partial string and used for the coding process which is carried out thereafter.

According to the LZW coding, the extension character is added to the following partial strings. For the sake of convenience, it will be assumed that the input character string is made up of three kinds of characters "a", "b" and "c" and is "ababcbababaaaaa . . . " as shown in FIG. 1A. In this case, reference numbers "1", "2"and "3" are respectively assigned to the three kinds of characters "a", "b" and "c" and registered in the dictionary before starting the coding process.

First, the first character "a" of the input character string is read and this character "a" is retrieved from the dictionary. The reference number "1" which corresponds to this read character "a" is then regarded as a code $\omega$ corresponding to the observed (or uncoded) character string.

Thereafter, the second and subsequent characters of the input character string are read successively, and each character is regarded as an extension character K. A partial string ($\omega$K) which is described as a combination ($\omega$K) of the above described code $\omega$ and the extension character K is then retrieved from the dictionary. When the partial string ($\omega$K) is retrieved from the dictionary, the reference number corresponding to the partial string ($\omega$K) is regarded as a new code $\omega$, and the above described process is repeated by reading the next character of the input character string. Hereafter, the combination ($\omega$K) will be referred to as a description of the partial string ($\omega$K).

The character string which is to be coded is successively extended one character at a time in the above described manner, and the extended character string is successively retrieved from the dictionary. As a result, the longest partial string which matches the observed character string out of the input character string is retrieved from the dictionary by successively retrieving the registered character strings. The reference number which corresponds to the longest character string which matches the observed character string is output as the code $\omega$. In addition, the partial string in which the extension word K is added to the partial string ($\omega$) corresponding to the reference number $\omega$ is described by the combination ($\omega$K) of the reference number $\omega$ and the extension character K, and this partial string is assigned a reference number and registered in the dictionary as a new partial string.

Therefore, the input character string shown in FIG. 1A is decomposed into the partial strings indicated by the underlines and coded into codes "1", "2", "4", . . . shown in FIG. 1B which correspond to the partial strings. FIG. 1C shows the corresponding relationship of the input character string and the partial strings registered in the dictionary. In addition, the following Table 1 shows an example of the dictionary which is formed.

TABLE 1

| Partial String | Code |
|---|---|
| a | 1 |
| b | 2 |
| c | 3 |
| 1b | 4 |
| 2a | 5 |
| 4c | 6 |
| 3b | 7 |
| 5b | 8 |
| 8a | 9 |
| 1a | 10 |

The dictionary which is formed during the LZW coding has a tree structure as shown in FIG. 2, and the elements of the dictionary correspond to nodes of the tree. In FIG.2, the number in brackets shown at each node indicates the reference number of the corresponding element of the dictionary.

If the registered elements of the dictionary are successively retrieved when retrieving the partial string during the coding process, the process would require too long a time. For this reason, the hashing method is used to retrieve the elements from the dictionary at a high speed.

According to the hashing method, a hashing function is defined using an element x of a set S which is made up of character strings. The hashing function is used to obtain an address of a storage location of the element x, and the element x is stored at the address which is obtained using the hashing function. The address which is obtained from the hashing function will be referred to as a hashing address.

For example, the reference number $\omega$ and the extension character K described above are described in binary numbers, and the combination ($\omega$K) of these binary numbers is regarded as the hashing address. However, the dictionary in this case requires an extremely large memory capacity.

For this reason, an open hashing (or chaining) method was proposed. The open hashing method uses a part of the hashing address and forms lists of elements having a value which is identical to the part of the hashing address. According to this open hashing method, a retrieval part is retrieved using the hashing address as shown in FIG. 3 so as to indicate the corresponding list. In addition, each list stores identification information corresponding to each element and a pointer which indicates a storage location of a next element, thereby making it possible to successively retrieve the elements from the dictionary.

For example, if the reference number $\omega$ is regarded as the hashing address, a starting address of a list, which stores partial strings added with one extension character to the partial string which corresponds to the reference number $\omega$, is stored at this hashing address, and partial strings corresponding to nodes which are "children (or sons)" of the node corresponding to the reference number $\omega$ are successively stored in the corresponding list. In this case, the extension character K of each element is stored in the list as the corresponding identification information.

FIG. 4 shows a flow chart for explaining a coding operation using the open hashing method for retrieving the elements from the dictionary.

As described above, the dictionary is initialized to include at least the first character of the input character string, and a variable n is set to the reference number which is assigned to the partial string which is to be registered next. For example, the reference numbers "1", "2" and "3" respectively assigned to the characters "a", "b" and "c" are stored in the dictionary as hashing addresses, and a numerical value "4" is set for the variable n.

Next, a maximum number of partial strings which can be registered in the dictionary is denoted by $N_{max}$, and sequences "Index", "List" and "Ext" respectively made up of $N_{max}$ components are defined. An initial value "0" is set to all the components of these sequences "Index", "List" and "Ext". The sequence "Index" corresponds to the retrieval part shown in FIG. 3, and the sequences "List" and "Ext" correspond to the lists. Accordingly, a number which indicates the component of the sequence "List" which becomes the head of the list corresponding to a node of the reference number i is set in the ith component "Index[i]" of the sequence "Index". In addition, the extension character K of the element of the dictionary indicated by the reference number i is set in the ith component "Ext[i]" of the sequence "Ext". A pointer which indicates the element corresponding to the "brother" of the element of the reference number i is set in the ith component "List[i]" of the sequence "List".

Next, the first character K is read, and the coding process is started by setting the reference number corresponding to this character K as the variable i.

First, a step 701 reads the next character K of the input character string, and a step 702 decides whether or not a next character to be read exists. When the decision result in the step 702 is YES, a retrieval process with respect to the dictionary starts.

In this case, a step 703 saves the variable i in another variable $\omega$ and sets a variable j to an initial value "0". A step 704 sets the number of the component of the sequence "List" which is indicated by the value of the component "Index[i]" corresponding to the variable i.

A step 705 decides whether or not the variable i is equal to "0". When the numerical value of the variable i is not "0" and the decision result in the step 705 is NO, a search process with respect to the corresponding list is started using the element included in this list as a candidate.

In this case, a step 706 decides whether or not the component "Ext[i]" which indicates the extension character of the corresponding element is equal to the extension character K. When the decision result in the step 706 is NO, a step 707 sets the pointer of the next element set in the component "List[i]" as the new variable i, and the process returns to the step 705. The search with respect to the corresponding list is made by repeating the steps 705 through 707 in the above described manner.

On the other hand, when the decision result in the step 706 is YES, it is decided that a partial string which matches the input character string is registered in the dictionary. Hence, in this case, the process returns to the step 701 to read the next character, and the character string added with this next character is coded.

When the value of the component "List[i]" or "Index[i]" corresponding to the variable i is "0", the decision result in the step S705 is YES.

When the value of the component "Index[i]" is "0", the element corresponding to the "child" of the node of the variable i is not yet registered, and it is indicated that the corresponding list is undefined. On the other hand, when the value of the component "List[i]" is "0", it is indicated that the desired partial string is not stored in the corresponding list.

In either case, the reference number which is saved in the variable $\omega$ in the step 703 indicates the partial string which is registered in the dictionary and makes a longest match with the input character string. A step 708 outputs a code corresponding to this reference number $\omega$, and carries out a registration process with respect to a new partial string.

First, a step 709 sets the value of the variable n in the variable i and increments the variable n. In addition, the step 709 sets the extension character K in the component "Ext[i]" corresponding to the variable i.

Next, a step 710 decides whether or not the value of the variable j is "0". When the decision result in the step 710 is YES, a step 711 sets the variable i in the component "Index[i]" and defines the list which corresponds to the reference number $\omega$. On the other hand, when the decision result in the step 710 is NO, a step 712 sets the variable i in the component "List[j]" and adds a new "sibling (or brother)" to the corresponding list.

When the registration process described above ends, a step 713 sets the reference number corresponding to the extension character K in the variable i, and the process returns to the step 701 to repeat the process described above. The decision result in the step 702 becomes NO when there are no more characters to be read. When the decision result in the step 702 is NO, a step 714 outputs a code corresponding to the variable ω at this time, and the process ends.

During the list retrieval process of the conventional method described above, three processes are carried out successively. The three processes are the connection deciding process which decides whether or not a corresponding list exists and whether or not a next element exists in the list, the match detecting process which detects a candidate character which matches the input extension character, and the reading process which sets the next pointer and reads information from the dictionary. However, when the successive processing of the list is carried out by software, it takes time to retrieve the partial strings and the speed of the coding process becomes on the order of several tens of kb/s. For this reason, there is a problem in that the coding process cannot be carried out in real time to suit the data transfer speed to a magnetic tape unit or a magnetic disk unit because the data transfer speed is in the order of several hundred kb/s to several Mb/s.

On the other hand, if the data compression system is formed by use of independent elements for each step of the coding process described above, it becomes possible to carry out the coding process at a high speed but there are problems in that the scale of the circuit becomes large and the system becomes expensive.

For the sake of convenience, the conventional method was described above for the case where the character sequence to be coded is made up of three kinds of characters. However, in actual practice, the character string to be coded is made up of a large number of kinds of characters. Accordingly, during the normal dictionary retrieval process, it takes the longest time to find a list which corresponds to a certain reference number and to successively retrieve the elements corresponding to the "sibling" so as to detect that no matching or connecting element exists.

SUMMARY OF THE INVENTION

Accordingly, it is a general object of the present invention to provide a novel and useful dictionary searching system in which the problems described above are eliminated.

Another and more specific object of the present invention is to provide a dictionary searching system for retrieving a character string which is described by input reference number and characters from a plurality of mutually different character strings which are registered in a dictionary in correspondence with reference numbers assigned to the character strings, which dictionary searching system comprises a dictionary including an index part and a list part, where the index part stores in correspondence with the reference numbers a reference number which is assigned to one of character strings which are obtained by adding a character to the character string which is assigned the input reference number and the character which is added to the one of the character strings, and the list part stores in correspondence with the reference numbers a reference number which is assigned to one of character strings having a last character which differs from that of the character string which is assigned the input reference number and the character which is added to the one of the character strings, reading means, coupled to the dictionary, for initially reading information from the index part by specifying the input reference number and thereafter reading information from the list part by specifying the reference number which is read from the dictionary, detecting means, coupled to the dictionary, for detecting each character which matches the input characters out of characters read from the dictionary and for outputting a result of this detection as a retrieval result, and deciding means, coupled to the dictionary, for deciding whether or not a reference number is included in an output of the dictionary and for outputting a result of this detection as a retrieval result, where the reading means, the detecting means and the deciding means operate independently of each other. According to the dictionary searching system of the present invention, it is possible to carry out the dictionary retrieval operation at a high speed and therefore carry out the coding process at a high speed, because the reading means, the detecting means and the deciding means respectively operate independently and there is no need to wait for a previous process to end.

Still another object of the present invention is to provide a dictionary searching system for retrieving a character string which is described by input reference number and characters from a plurality of mutually different character strings which are registered in a ditionary in correspondence with reference numbers assigned to the character strings, which dictionary searching system comprises a dictionary including an index part and a list part, where the index part stores in correspondence with the reference numbers identification information corresponding to one of candidate character strings which are obtained by adding a character to the character string which is assigned the input reference number and pointers which indicate storage locations of other candidate character strings, and the list part stores in correspondence with the reference numbers identification information corresponding to one of candidate character strings having a last character which differs from that of the character string which is assigned the input reference number and pointers which indicate storage locations of other candidate character strings, reading means, coupled to the dictionary, for initially reading the pointer and identification information from the index part based on the input reference number and thereafter reading the pointer and identification information from the list part by specifying the list part by the pointer which is read from the dictionary, detecting means, coupled to the dictionary, including comparator means for comparing each identification information read from the dictionary with the input characters, for detecting each character which matches the input characters out of the candidate character string read from the dictionary and for outputting a result of this detection as a retrieval result, and deciding means, coupled to the dictionary, for deciding whether or not an unread candidate character string exists in the dictionary based on the pointer read from the dictionary and for outputting a result of this detection as a retrieval result, where the reading means, the detecting means and the deciding means operate independently of each other. According to the dictionary searching system of the present invention, it is possible to carry out the dictionary retrieval operation at a high speed and therefore carry out the coding process at a high speed, because the reading means, the detecting means and the deciding means respectively operate independently and there is no need to wait for a previous process to end.

Other objects and further features of the present invention will be apparent from the following detailed description when read in conjunction with the accompanying drawings.

BRIEF DESCRIPTION OF THE DRAWINGS

FIGS. 1A through 1C respectively are diagrams for explaining an LZW coding;

FIG. 10 shows a data structure of data stored in a dictionary of the second embodiment.

DESCRIPTION OF THE PREFERRED EMBODIMENTS

Figure 5:
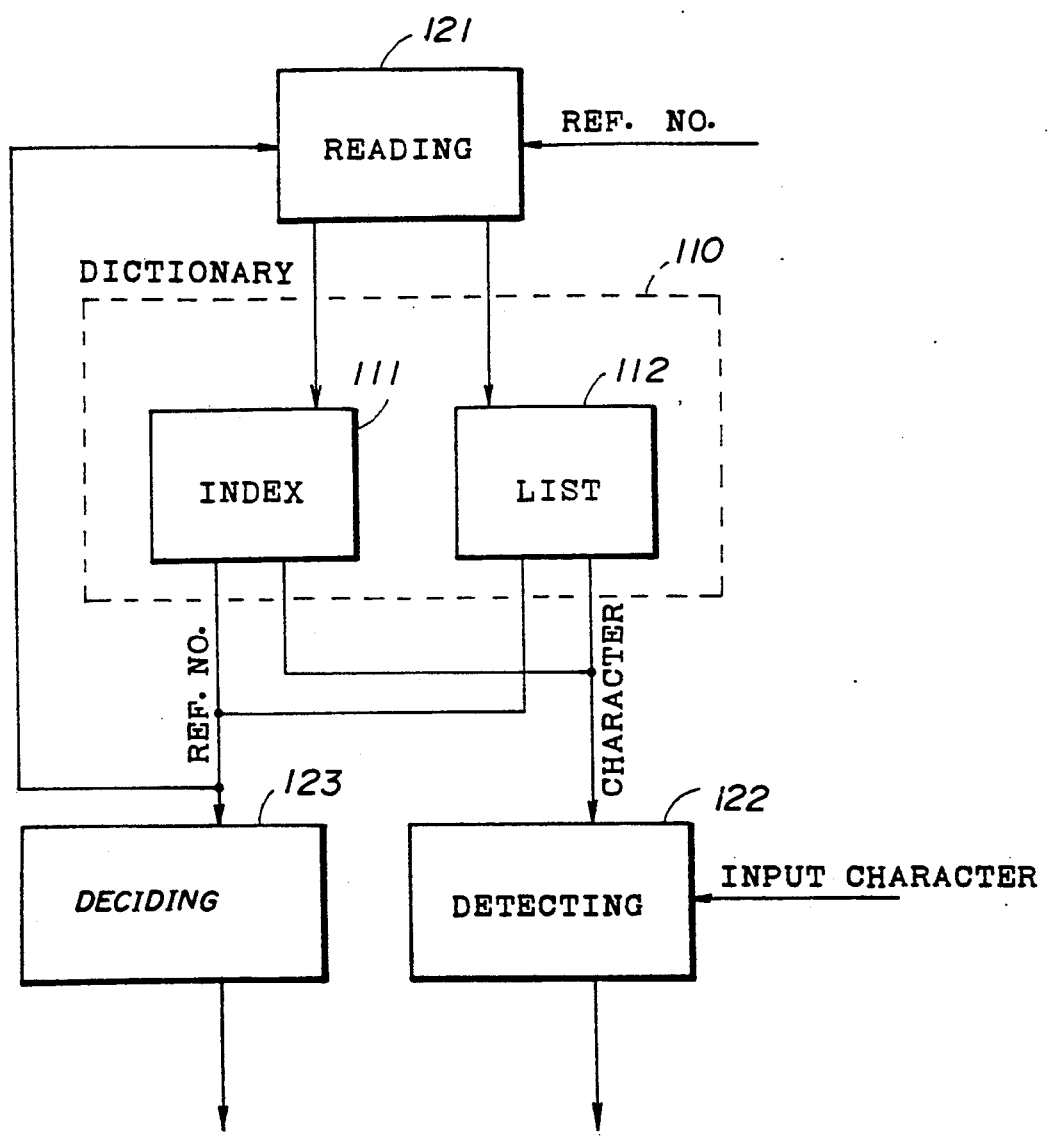
FIG. 5 is a system block diagram for explaining an operating principle of a first embodiment of a dictionary searching system according to the present invention.

FIG. 5 shows an essential part of a first embodiment of a dictionary searching system according to the present invention. The dictionary searching system generally includes a reading means 121, a dictionary 110 which is made up of an index 111 and a list 112, a detecting means 122, and a deciding means 123.

The dictionary searching system retrieves a character string which is described by a reference number and a character from the dictionary 110 which registers mutually different character strings in correspondence with reference numbers assigned to the character strings. The index 111 stores the reference number which is assigned to one of the character strings which are obtained by adding one character to the character strings to which the reference numbers are assigned, and the character which is added to the one character string. The list 112 stores the reference number which is assigned to one of the character strings having a last character which differs from that of the character strings to which the reference numbers are assigned, and the character which is added to the one character string.

The reading means 121 initially reads information from the index by specifying the input reference number. Thereafter, the reading means 121 reads the information from the list by specifying the reference number which is read from the dictionary 110.

The detecting means 122 detects the character which matches the input character out of the characters which are read from the dictionary 110. The detecting means 122 outputs this result of the detection as a retrieval result.

The deciding means 123 decides whether or not the reference number is included in the output of the dictionary 110. The deciding means 123 outputs this result of the decision as a retrieval result.

This embodiment is characterized in that the reading means 121, the detecting means 122 and the deciding means 123 operate independently of each other.

The index 111 of the dictionary 110 stores in correspondence with the reference numbers one of the character strings which are obtained by adding one character to the character strings to which the reference numbers are assigned, and the character which is added to the one character string. In other words, the index 111 stores the reference number which is assigned to the character string which corresponds to one of the nodes connected as "children" to the nodes of the tree of the dictionary corresponding to the reference numbers, and the character which is added to this character string. In addition, the list 112 of the dictionary 110 stores in correspondence with the reference numbers one of the character strings having a last character which differs from that of the character strings to which the reference numbers are assigned, and the character which is added to the one character string. That is, the list 112 stores the reference number which is assigned to the character string which corresponds to one of the nodes corresponding to a "sibling" of the node of the tree of the dictionary corresponding to the reference numbers, and the character which is added to this character string.

Initially, the reading means 121 specifies the input reference number and reads the information from the index 111. Thereafter, the reading means 121 specifies the reference number which is read from the dictionary 110 and reads the information from the list 112. Accordingly, the information is read from the list based on the reference number which is read from the dictionary 110, and the nodes connected as "children" to the node which corresponds to the reference number are successively searched.

The reference number used is the reference number assigned to the part of the input character string excluding the last character, and the last character is input to the detecting means 122.

When the detecting means 122 detects from the characters read from the dictionary 110 a character which matches the input character, the detecting means 122 outputs a retrieval result which indicates that a corresponding character string is detected from the dictionary 110.

On the other hand, when no corresponding reference number is stored in the index 111 or when no corresponding reference number is stored in the list 112, the deciding means 123 decides that no reference number is included. In this case, the deciding means 123 outputs a retrieval result which indicates that no corresponding character string is registered in the dictionary 110.

Because the reading means 121, the detecting means 122 and the deciding means 123 operate independently of each other, the reading process for reading information from the dictionary, the match detecting process and the connection deciding process are carried out independently of each other. For this reason, unlike the conventional method which successively carries out the reading process, the match detecting process and the connection deciding process, there is no need in this embodiment to wait for a previous process to end before carrying out a process. As a result, it is possible to carry out the dictionary retrieval process at a high speed according to this embodiment.

In the first embodiment, the reading means 121 may read information from the dictionary 110 at predetermined time intervals, and the match detecting process of the detecting means 122 and the connection deciding process of the deciding means 123 may be carried out in parallel with, that is, simultaneously to the reading process of the reading means 121.

In this case, the reading means 121 carries out the reading process for every time which is required to read the information from the dictionary 110. Normally, the times required to carry out the match detecting process of the detecting means 122 and the connection deciding process of the deciding means 123 are short compared to the time required to carry out the reading process of the reading means 121. Accordingly, it is possible to carry out the retrieval process as a pipeline process by carrying out the reading, match detecting and connection deciding processes in parallel, that is, simultaneously. As a result, it is possible to retrieve the character strings from the dictionary 110 at a high speed.

Figure 6:
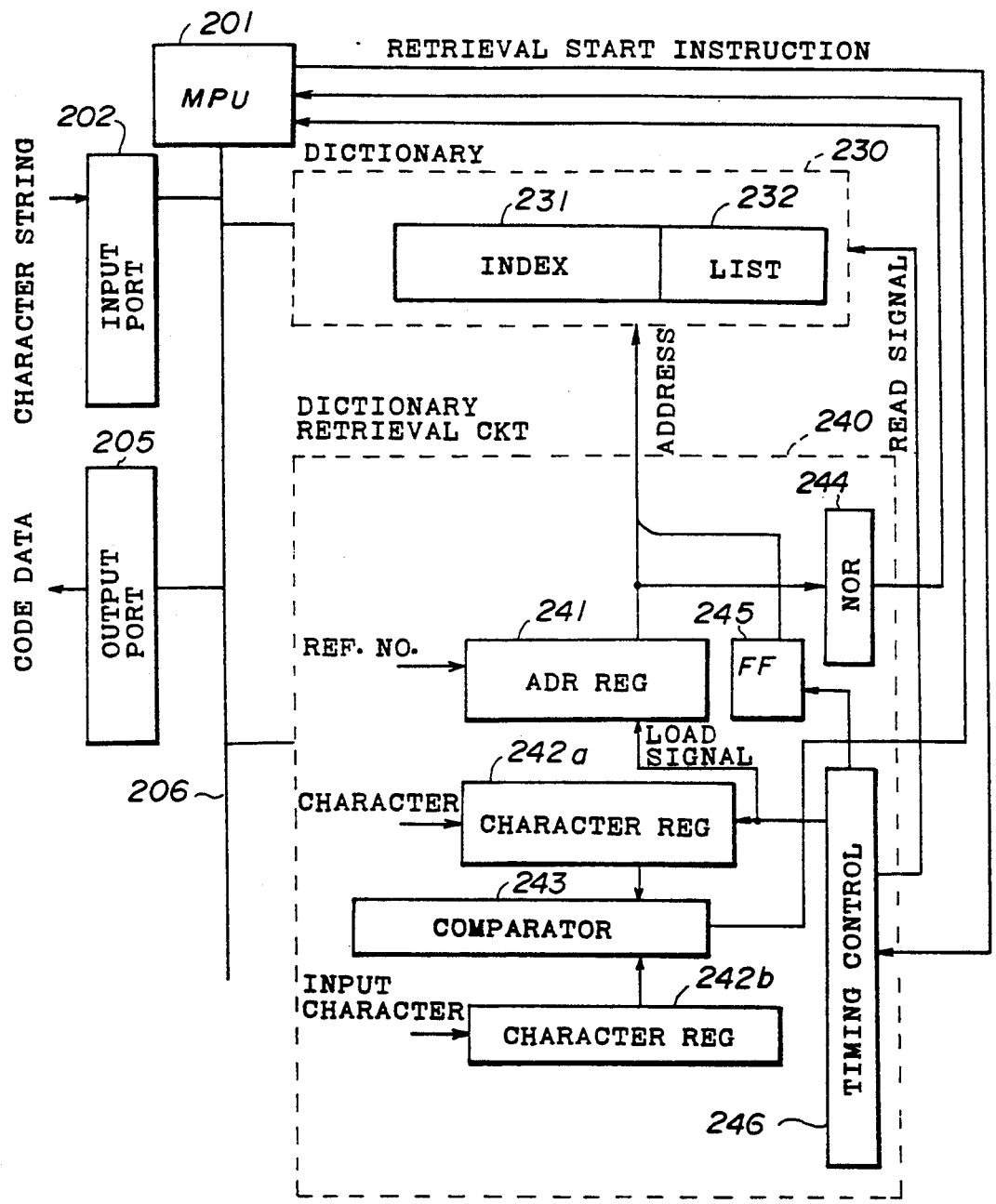
FIG. 6 is a system block diagram showing an essential part of a data compression system applied with the first embodiment.

Next, a more detailed description will be given of the first embodiment, by referring to FIG. 6. FIG. 6 shows an essential part of a data compression system which is applied with the first embodiment. The corresponding relationships of the elements shown in FIGS. 5 and 6 are as follows.

A dictionary 230 shown in FIG. 6 corresponds to the dictionary 110 shown in FIG. 5. An index part 231 and a list part 232 shown in FIG. 6 respectively correspond to the index 111 and the list 112 shown in FIG.5. An address register 241, a character register 242a, a flip-flop 245 and a timing control circuit 246 shown in FIG. 6 correspond to the reading means 121 shown in FIG.5. A character register 242b and a comparator circuit 243 shown in FIG. 6 correspond to the detecting means 122 shown in FIG.5. In addition, a NOR circuit 244 shown in FIG. 6 corresponds to the deciding means 123 shown in FIG.5.

In FIG. 6, the data compression system includes a microprocessor unit (MPU) 201, an input port part 202, the dictionary 230, a dictionary retrieval circuit 240 and an output port part 205. The MPU 210, the input port part 202, the dictionary 230, the dictionary retrieval circuit 240 and the output port part 205 are coupled to each other via a bus 206.

An input character string which is input via the input port part 202 is subjected to an LZW coding in the MPU 201. The coded data from the MPU 201 is transferred to a magnetic disk unit (not shown) or the like via the output port part 205 and is stored therein. The dictionary retrieval circuit 240 carries out the retrieval process with respect to the dictionary 230 when storing the coded data into the magnetic disk unit or the like.

Figure 7:
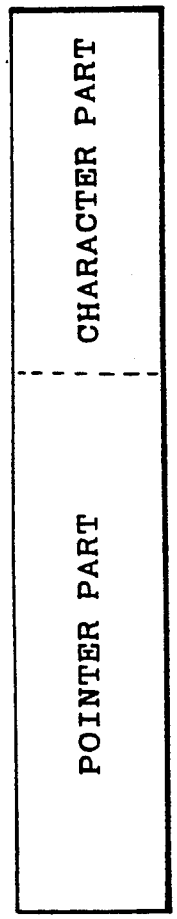
FIG. 7 shows a data structure of data stored in a dictionary of the first embodiment.
Figure 4:
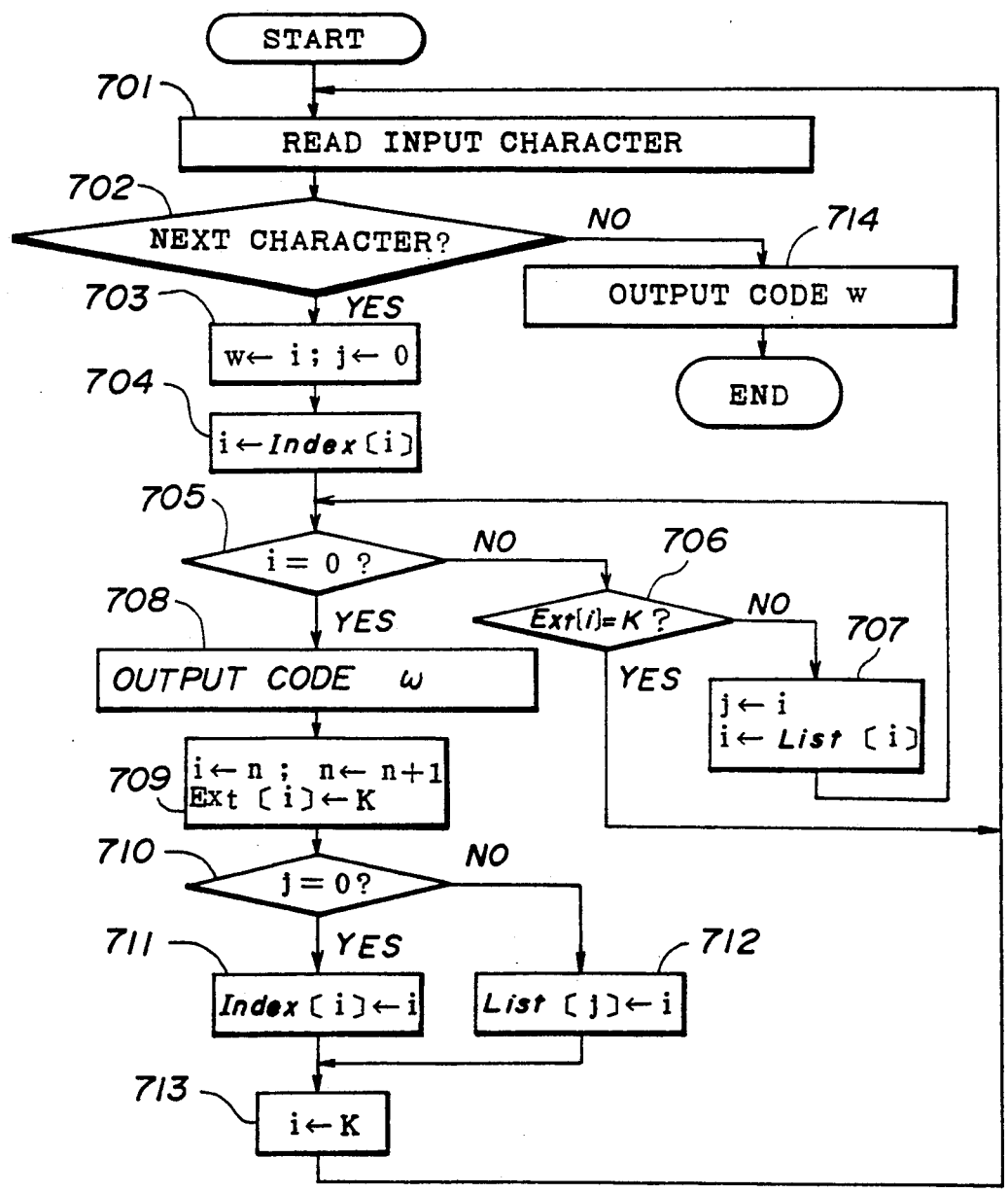
FIG. 4 is a flow chart for explaining a conventional coding using the open hashing method for the dictionary retrieval.

The dictionary 230 is made up of $2N_{max}$ regions, and addresses "1" through $2N_{max}$" are assigned to each of the $2N_{max}$ regions. Out of the $2N_{max}$ regions, the regions which are specified by addresses with a most significant bit (MSB) which is "0" are allocated for the index part 231, and the regions which are specified by addresses with a MSB which is "1" are allocated for the list part 232. Each region of the index and list parts 231 and 232 corresponds to a reference number which is described by a lower portion of the addresses excluding the MSB. In addition, each region of the index and list parts 231 and 232 is formed by a pointer part and a character part as shown in FIG. 7, and the pointer and character parts are read simultaneously. For example, when each region has a capacity of two words, the upper word is used as the pointer part and the lower word is used as the character part.

The pointer part of each region of the index part 231 stores a reference number corresponding to a partial string which appears first out of the partial strings in which one character is added to the character strings which are assigned corresponding reference numbers. The character part of each region of the index part 231 stores the extension character which is added to the partial string corresponding to the reference number which is stored in the pointer part of the region.

The pointer part of each region of the list part 232 stores a reference number corresponding to a partial string which appears next out of the partial strings in which the last character is different from that of the character strings which are assigned corresponding reference numbers. The character part of each region of the list part 232 stores the extension character which is added to the partial string corresponding to the reference number which is stored in the pointer part of the region.

An initial value "0" is set in each region of the index part 231 and the list part 232 before the coding process is started.

The dictionary retrieval circuit 240 includes the address register 241, the character registers 242a and 242b, the comparator circuit 243, the NOR circuit 244, the flip-flop 245 and the timing control circuit 246.

Out of the data which is received via the bus 206, the upper word, that is, the reference number which is read from the pointer part of each region of the index part 231 or the list part 232 of the dictionary 230, is input to the address register 241. In addition, the lower word, that is, the character which is read from the character part of each region of the index part 231 or the list part 232 of the dictionary 230, is input to the character register 242a. On the other hand, one character within the character string input via the input port part 202 is successively set in the character register 242b by the MPU 201.

The output of the address register 241 is input to the dictionary 230 as the lower part of the address, and the output of the flip-flop 245 is input to the dictionary 230 as the MSB of the address.

The comparator circuit 243 compares the characters stored in the character registers 242a and 242b, and outputs a logic signal "1" when the two compared characters match. This output logic signal of the comparator circuit 243 is notified to the MPU 201.

The output of the address register 241 is also input to the NOR circuit 244. The NOR circuit 244 outputs a logic signal "1" when the reference number stored in the address register 241 has the initial value "0", and this output logic signal of the NOR circuit 244 is notified to the MPU 201.

The timing control circuit 246 outputs a read signal which instructs a read process for reading information from the dictionary 230 depending on an instruction from the MPU 201. Furthermore, the timing control circuit 246 outputs a load signal for controlling the timings with which the data are stored in the address register 241 and the character register 242a.

Next, a description will be given of the retrieval operation of the dictionary retrieval circuit 240 carried out with respect to the dictionary 230.

First, the MPU 201 inputs to the character register 242b of the dictionary retrieval circuit 240 one character which is newly input via the input port part 202. In addition, the MPU 201 inputs to the address register 241 the reference number $\omega$ which corresponds to the character string which is to be coded by adding the above described character, and instructs the start of the retrieval operation to the timing control circuit 246.

For example, when the character string shown in FIG. 1A is successively input via the input port part 202, the MPU 201 first obtains the hashing address (for example, "1") which corresponds to the first character "a" and inputs this hashing address to the address register 241. In addition, the MPU 201 reads the next character "b" and inputs this character "b" to the character register 242b. Moreover, the MPU 201 instructs the start of the retrieval operation to the timing control circuit 246.

In response to the retrieval start instruction from the MPU 201, the timing control circuit 246 first resets the output logic signal of the flip-flop 245 to "0", and thereafter inputs a read signal to the dictionary 230 to start the reading process.

The corresponding reference number and the character are read from the region of the index part 231 of the dictionary 230 corresponding to the reference number in response to the read signal. The reference number and the character which are read are input to the dictionary retrieval circuit 240 via the bus 206, and the reference number is input to the address register 241 while the character is input to the character register 242a.

After outputting the read signal, the timing control circuit 246 inputs the load signal to the address register 241 and the character register 242a after a predetermined time $\tau$. This predetermined time (read cycle time) $\tau$ is the time required to read the data from the dictionary 230 from the time when the read signal is output from the timing control circuit 246.

The address register 241 stores the reference number in response to the load signal. On the other hand, the character register 242a stores the character in response to the load signal.

Thereafter, the timing control circuit 246 sets a logic signal "1" in the flip-flop 245 and outputs a read signal. In addition, the timing control circuit 246 outputs a load signal after the read cycle time $\tau$ elapses from the time when the read signal is output. Then, unless an instruction is received from the MPU 201, the timing control circuit 246 repeats the above described operation, and repeats the reading process for every read cycle time $\tau$. However, it is unnecessary to repeat the operation of setting the logic signal "1" in the flip-flop 245.

By setting the logic signal "1" in the flip-flop 245, the MSB of the address is changed from "0" to "1". Hence, the reading process with respect to the list part 232 is thereafter carried out for every read cycle time $\tau$ described above.

By using the reference number which is read from the dictionary 230 to specify the next read address, the extension character added to the partial string which is connected as a "child" to the partial string corresponding to the reference number $\omega$ in the tree of the dictionary 230 is successively read and stored in the character register 242a. This process is equivalent to successively reading the partial string corresponding to the "child" of the partial string which corresponds to the reference number $\omega$.

The comparator circuit 243 compares the character which is previously read and stored in the character register 242a and the extension character K which is stored in the character register 242b in parallel with the reading process described above. Accordingly, every time a new character is read from the dictionary 230, the comparator circuit 243 successively compares the character read from the dictionary 230 with the extension character K, and supplies a logic signal "1" to the MPU 201 when the two compared characters match.

Therefore, the match detecting process of the comparator circuit 243 which corresponds to the conventional match detecting process is carried out in parallel with the reading process.

For this reason, when the logic signal "1" is received from the comparator circuit 243, the MPU 201 decides that a partial string in which the extension character K is added to the partial string corresponding to the reference number $\omega$ is retrieved. In this case, the MPU 201 reads the next character of the input character string and stores this character in the character register 242b, and instructs the timing control circuit 246 to start the retrieval operation. As a result, the retrieval of a partial string in which a character is further added to the retrieved partial string is similarly started.

In the above described case, the reference number which is stored in the address register 241 is the reference number corresponding to the retrieved partial string. Hence, the MPU 201 does not need to store the corresponding reference number in the address register 241 again.

On the other hand, the logical operation process of the NOR circuit 244 is also carried out independently of the reading process. Accordingly, the logical operation process with respect to the previously read reference number is carried out in parallel with the reading process. When the reference number read from the dictionary 230 has the initial value "0", the NOR circuit 244 inputs a logic signal "1" to the MPU 201.

When the reference number read from the dictionary 230 has the initial value "0", this indicates that no corresponding partial string is registered in the dictionary 230. By deciding whether or not the reference number read from the dictionary 230 has the initial value "0", it is possible to carry out with the NOR circuit 244 the connection deciding process which corresponds to to the conventional step 705 in parallel with the reading process described above.

Accordingly, when the output logic signal of the NOR circuit 244 becomes "1", the MPU 201 instructs the timing control circuit 246 to discontinue the retrieval operation. In addition, the MPU 201 outputs as the code the reference number $\omega$ corresponding to the partial string which is retrieved last, via the output port part 205, and carries out the process of registering the new partial string in the dictionary 230.

For example, the MPU 201 supplies an address to the dictionary 230, and this address is obtained by adding the output of the flip-flop 245 within the dictionary retrieval circuit 240 as the MSB to the reference number $\omega$ described above. Hence, a new reference number and the extension character K are stored in the dictionary 230.

When the output logic signal of the flip-flop 245 is reset to "0", the new reference number and the extension character K are stored at the corresponding address of the index part 231 within the dictionary 230. The new reference number and the extension character K are registered as elements corresponding to the "children" of the element of the reference number which is stored in the address register 241. On the other hand, when the output logic signal of the flip-flop 245 is set to "1", the new reference number and the extension character K are stored at the corresponding address of the list part 232. In this case, the new reference number and the extension character K are registered as elements corresponding to the "sibling" next to the reference number which is stored in the address register 241.

The input character string is successively coded in the above described manner, and the new partial strings are registered in the dictionary 230.

Figure 2:
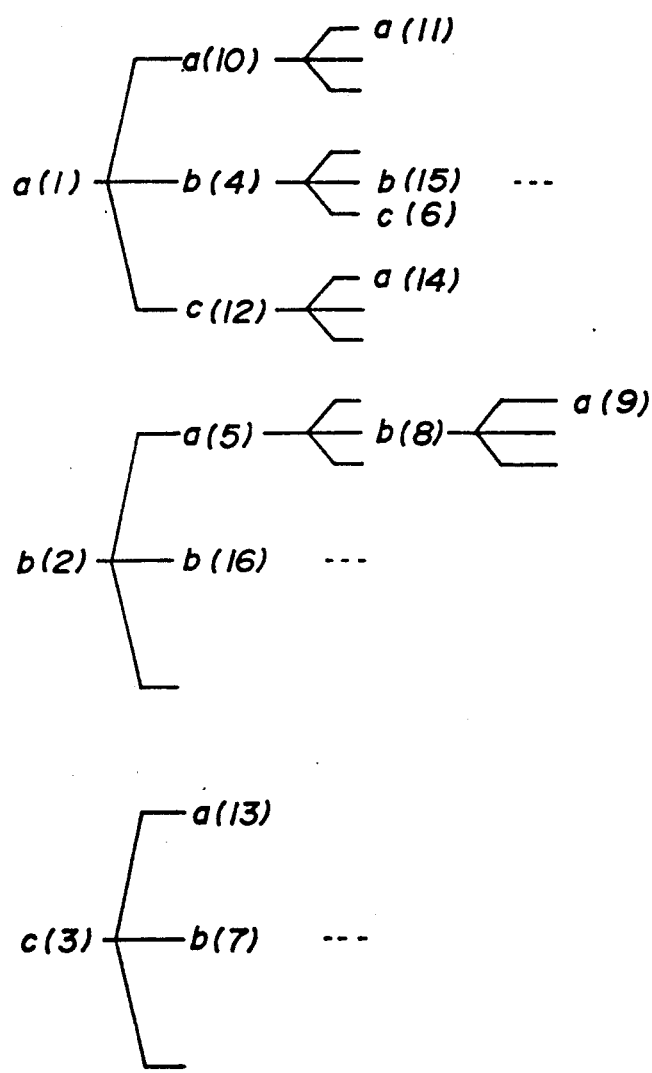
FIG. 2 is a diagram for explaining a tree structure of a dictionary.
Figure 3:
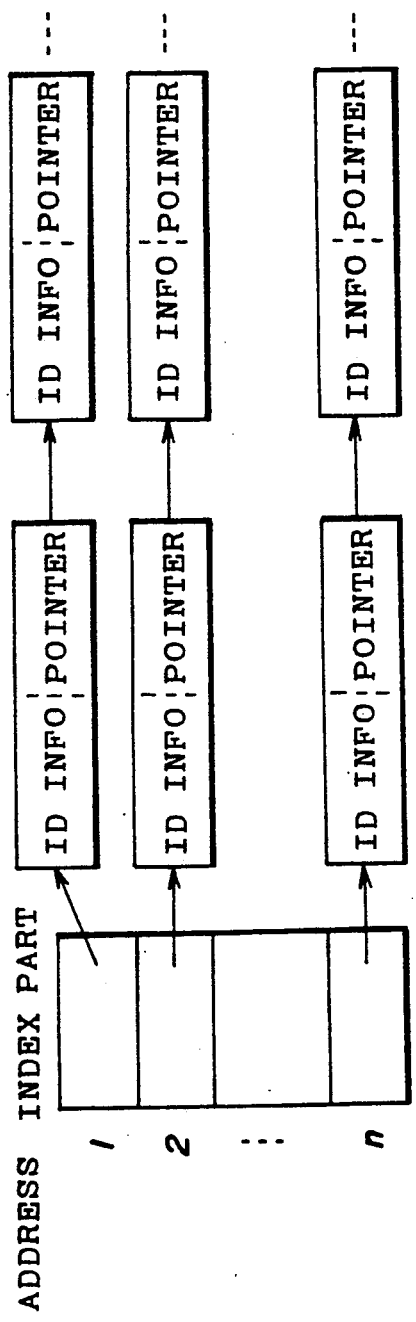
FIG. 3 is a diagram for explaining an open hashing method.

The following Table 2 shows the index part 231 and the list part 232 of the dictionary 230 which are obtained by applying this embodiment to the dictionary shown in FIG. 2. In Table 2, the numbers shown on the left of each column indicates the reference number, and "Extension Char." denotes the extension character.

TABLE 2

|    | Index Part 231 | | List part 232 | |
|----|---------|----------------|---------|----------------|
|    | Pointer | Extension Char.| Pointer | Extension Char.|
| 1  | 4  | b |    |   |
| 2  | 5  | a |    |   |
| 3  | 7  | b |    |   |
| 4  | 6  | c | 10 | a |
| 5  | 8  | b | 16 | b |
| 6  | 0  |   | 15 | b |
| 7  | 0  |   | 13 | a |
| 8  | 9  | a | 0  |   |
| 9  | 0  |   | 0  |   |
| 10 | 11 | a | 12 | c |
| 11 | 0  |   | 0  |   |
| 12 | 14 | a | 0  |   |
| 13 | 0  |   | 0  |   |
| 14 | 0  |   | 0  |   |
| 15 | 0  |   | 0  |   |
| 16 | 0  |   | 0  |   |

As described above, the dictionary retrieval circuit 240 is formed by the address, register 241, the two character registers 242a and 242b, the comparator circuit 243 and the NOR circuit 244. And, the timing control circuit 246 is used to carry out the reading process for every read cycle time τ with respect to the dictionary 230.

The comparator circuit 243 and the NOR circuit 244 operate independently of the reading process carried out with respect to the dictionary 230. Accordingly, the comparing process of the comparator circuit 243 and the logical operation process of the NOR circuit 244 are carried out for the previously read partial string under the control of the timing control circuit 246, in parallel with the reading process which is carried out for the next partial string.

Because the connection deciding process, the match detecting process and the reading process are carried out by independent circuits (that is, the NOR circuit 244, the comparator circuit 243 and the timing control circuit 246), these processes can be carried out by pipeline processing. In this case, the time required to make one retrieval from the list is the read cycle time τ from the dictionary 230.

Therefore, it is possible to retrieve the character strings from the dictionary 230 at a high speed using the simple circuit shown in FIG. 6. For this reason, it is possible to reduce the time required to carry out the retrieval process with respect to the dictionary 230, carry out the coding process at a high speed, make the coding speed approximately the same as the data transfer speed to the magnetic disk unit or the like, and transfer the coded data to the magnetic disk unit or the like in real time.

As shown in FIG. 6, the dictionary retrieval circuit 240 has a simple circuit construction and will not greatly increase the hardware of the data compression system. In addition, the MPU 201 simply needs to operate when the comparator circuit 243 and the NOR circuit 244 output the logic signal "1", and does not need to operate at a particularly high speed.

The description given above refers to the case where this embodiment is applied to the data compression system. However, this embodiment, that is, the present invention, is applicable to any system which uses the open hashing method to retrieve information from a dictionary which has a tree structure.

Figure 8:
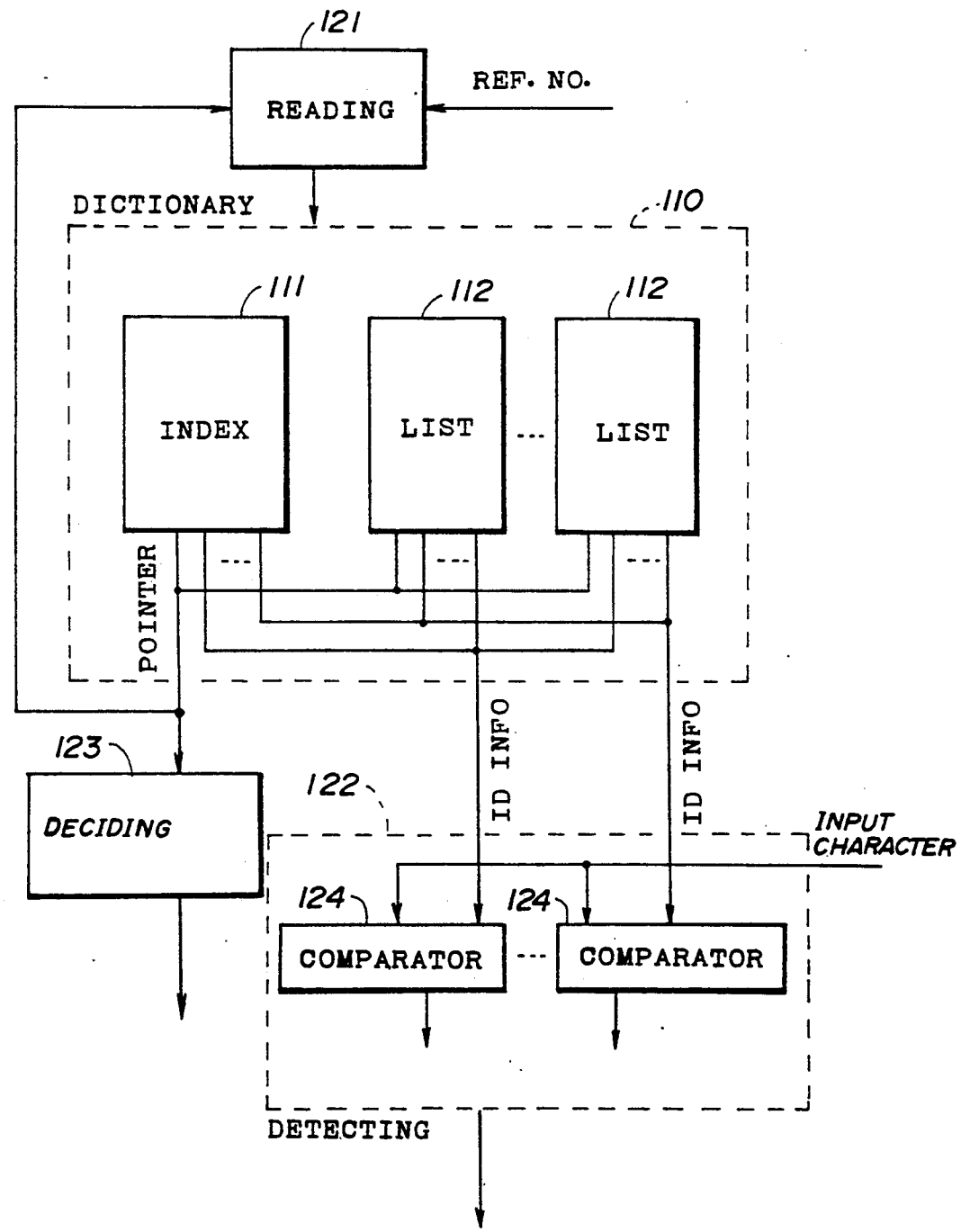
FIG. 8 is a system block diagram for explaining an operating principle of a second embodiment of the dictionary searching system according to the present invention.

Next, a description will be given of an operating principle of a second embodiment of the dictionary searching system according to the present invention, by referring to FIG. 8. In FIG. 8, those parts which are essentially the same as those corresponding parts in FIG.5 are designated by the same reference numerals, and a description thereof will be omitted.

In this embodiment, a character string described by an input reference number and character is retrieved from a dictionary 110 in which mutually different character strings are registered in correspondence with reference numbers assigned thereto. The dictionary 110 includes an index 111 and a plurality of lists 112. The index 111 stores identification information related to at least one of candidate character strings which are obtained by adding a character to the character string which is assigned the corresponding reference number, and a pointer which indicates the storage locations of other candidate character strings. The lists 112 store identification information related to at least one of candidate character strings in which the last character is different, and a pointer which indicates the storage locations of other candidate character strings.

First, the reading means 121 instructs the dictionary 110 to output the pointer and the identification information stored in the index 111 based on the input reference number. Thereafter, the reading means 121 specifies the list 112 which is indicated by the pointer output from the index 111 of the dictionary 110 and instructs the dictionary 110 to output the pointer and the identification information stored in the list 112.

The detecting means 122 includes a plurality of comparator means 124 for comparing the identification information read from the dictionary 110 and the input character. The detecting means 122 detects a corresponding character string from the candidate character strings which are read from the dictionary 110, and outputs the detected character string as a retrieval result.

The deciding means 123 decides whether or not a candidate character string which is not yet read exists based on the pointer read from the dictionary 110. The deciding means 123 outputs a decision result as a retrieval result.

Similarly as in the case of the first embodiment, the reading means 121, the detecting means 122 and the deciding means 123 operate independently of each other.

The index 111 of the dictionary 110 stores in correspondence with the reference numbers the identification information related to at least one of the candidate character strings which are obtained by adding one character to the character strings corresponding to the reference numbers, and the pointer which indicates the storage locations of other candidate character strings. In addition, each list 112 stores the identification information related to the one of the candidate character strings in which the last character mutually differs, and the pointer which indicates the storage locations of other candidate character strings.

The index 111 corresponds to the index part used by the open hashing method, and each list 112 corresponds to the list used by the open hashing method. In addition, the connection relationships of the index 111 and the lists 112 are indicated by the pointers stored in the index 111 and the lists 112. The reference number which is assigned to the candidate character string and the last character of the character string may be stored as the identification information.

First, the reading means 121 instructs the dictionary 110 to output the pointer and the identification information related to at least one of the candidate character strings stored in the index 111 based on the input reference number. Thereafter, the reading means 121 instructs the dictionary 110 to output the pointer and the identification information stored in the list 112 which is indicated by the pointer output from the index 111 of the dictionary 110. Hence, the candidate character strings are successively read from the lists 112 at least one candidate character string at a time, which lists 112 are connected to the index 111 by the pointer output from the index 111.

The identification information read from the dictionary 110 is compared with the input character in the corresponding comparator means 124 of the detecting means 122. The detecting means 122 detects the corresponding character string based on the results of the comparisons made in the comparator means 124. For example, when the reference number of the candidate character string and the last character are stored as the identification information, the comparator means 124 compares the input character with the last character which is included in each piece of identification information. When the two compared characters match, the detecting means 123 outputs a retrieval result which indicates that the corresponding character string is detected.

Based on the pointer read from the dictionary 110, the deciding means 123 decides whether or not there exists a candidate character string which is not yet read from the dictionary 110. For example, when the storage location of the list to be connected next is not indicated by a pointer, the deciding means 123 decides that there is no candidate character string which is not yet read from the dictionary 110, and the result of this decision is output as a retrieval result.

According to this embodiment, at least one candidate character string is stored in each of the index 111 and the lists 112 of the dictionary 110, and the detecting means 122 is provided with the plurality of comparator means 124. For this reason, it is possible to simultaneously read candidate character strings from each of the index 111 and the lists 112 of the dictionary 110, and carry out the match detecting process for the candidate character strings which are read from the dictionary 110. In addition, since the reading means 121, the detecting means 122 and the deciding means 123 operate independently of each other, it is unnecessary to wait for a previous process to end as in the case of the conventional method, and the dictionary retrieval operation can be carried out at a high speed.

The reading means 121 may start the read process with respect to the dictionary 110 at predetermined time intervals. In this case, the match detecting process of the detecting means 122 and the connection deciding process of the deciding means 123 may be carried out in parallel with the reading process of the reading means 121. For example, the reading means 121 carries out the reading process every time the information is required to be read from the dictionary 110. Normally, the times required to carry out the match detecting process of the detecting means 122 and the connection deciding process of the deciding means 123 are short compared to the time required to carry out the reading process of the reading means 121. Accordingly, it is possible to carry out the retrieval process as a pipeline process by carrying out the reading, match detecting and connection deciding processes in parallel, that is, simultaneously. As a result, it is possible to retrieve the character strings from the dictionary 110 at a high speed.

Figure 9:
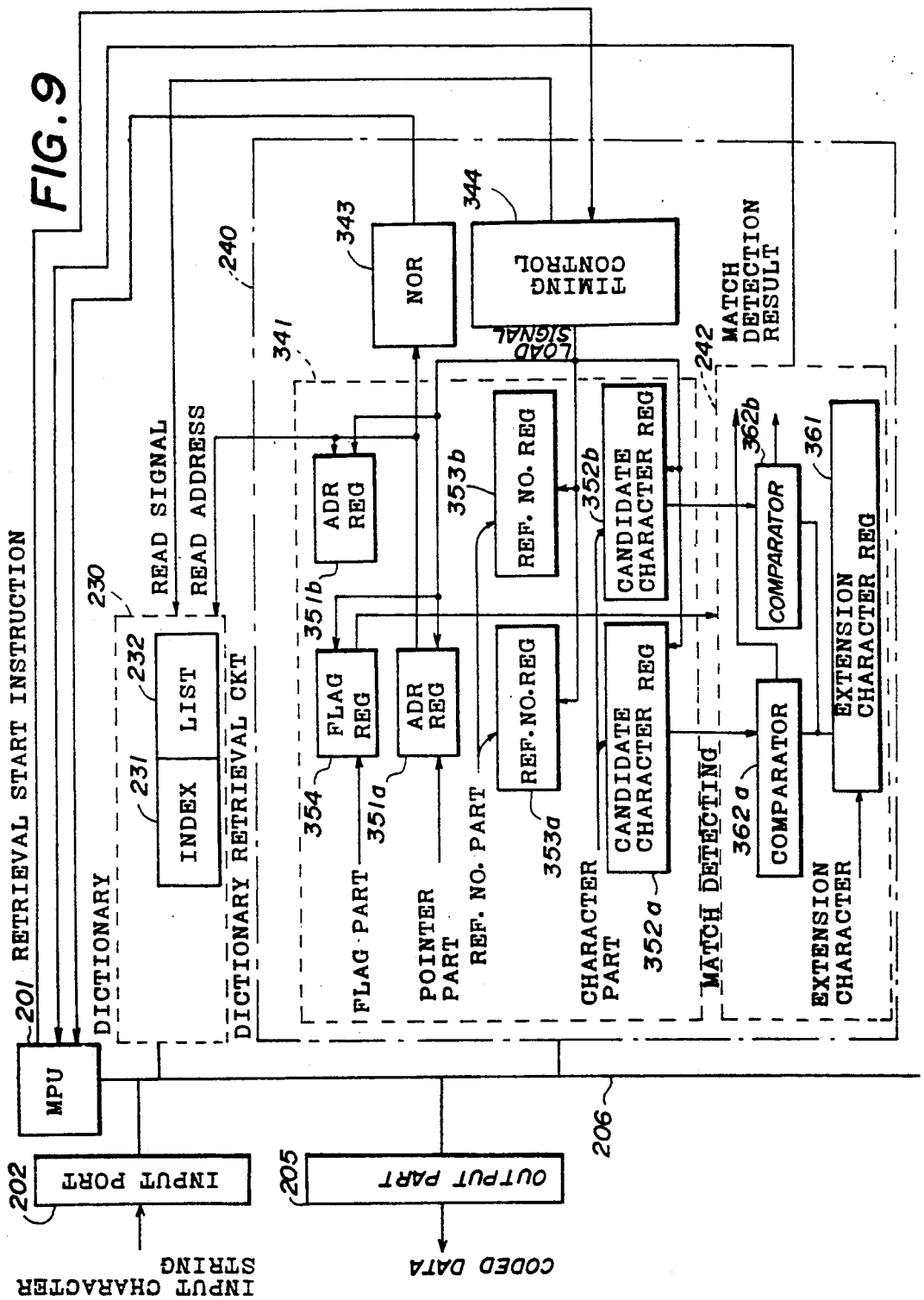
FIG. 9 is a system block diagram showing an essential part of a data compression system applied with the second embodiment.

Next, a more detailed description will be given of the second embodiment, by referring to FIG. 9. FIG. 9 shows an essential part of a data compression system which is applied with the second embodiment. In FIG. 9, those parts which are essentially the same as those corresponding parts in FIG. 6 are designated by the same reference numerals, and a description thereof will be omitted. The corresponding relationships of the elements shown in FIGS. 8 and 9 are as follows.

A dictionary 230 shown in FIG. 9 corresponds to the dictionary 110 shown in FIG. 8. An index part 231 and a list part 232 shown in FIG.9 respectively correspond to the index 111 and the lists 112 shown in FIG. 8. A candidate element holding part 341 and a timing control circuit 344 shown in FIG.9 correspond to the reading means 121 shown in FIG.8. Comparator circuits 362a and 362b shown in FIG.9 correspond to the comparator means 124 shown in FIG.8. An extension character register 361 and the comparator circuits 362a and 362b correspond to the detecting means 122 shown in FIG.8. A NOR circuit 343 corresponds to the deciding means 123.

In FIG.9, the data compression system includes a microprocessor unit (MPU) 201, an input port part 202, the dictionary 230, a dictionary retrieval circuit 240 and an output port part 205. The MPU 210, the input port part 202, the dictionary 230, the dictionary retrieval circuit 240 and the output port part 205 are coupled to each other via a bus 206.

An input character string which is input via the input port part 202 is subjected to an LZW coding in the MPU 201. The coded data from the MPU 201 is transferred to a magnetic disk unit (not shown) or the like via the output port part 205 and is stored therein.

The mutually different partial strings included in the character strings which are input up to the present are registered in the dictionary 230. The partial string which makes a longest match to the input character string is retrieved from the dictionary 230, and the input character string is coded using the reference number which corresponds to the retrieved partial string.

When carrying out the LZW coding process, the MPU 201 inputs to the dictionary retrieval circuit 240 the identification information related to the observed part of the input character string. Based on this identification information, the dictionary retrieval circuit 240 retrieves the corresponding partial string from the dictionary 230. According to the LZW coding, the partial string is described by the reference number $\omega$ and the extension character K. Hence, the observed part of the input character string may be described by the reference number ω corresponding to the partial string which is retrieved up to the present and the last character K which is added to this partial string as the extension character. The MPU 201 can thus input the reference number ω and the extension character K to the dictionary retrieval circuit 240 as the identification information.

In addition, out of the partial strings registered in the dictionary 230, the dictionary retrieval circuit 240 successively reads as the candidate elements the partial strings which are registered by adding a different character to each of the partial strings corresponding to the reference number ω. The dictionary retrieval circuit 240 retrieves the corresponding partial string from these candidate elements.

The dictionary 230 is made up of the index part 231 corresponding to the index used by the open hashing method, and the list part 232 corresponding to a collection of lists used by the open hashing method.

FIG.10 shows the structure of the index part 231 and the list part 232 for a case where two candidate elements are read at a time from the dictionary 230.

As shown in FIG.10, the index part 231 is formed from storage regions respectively corresponding to the reference numbers. Each storage region of the index part 231 includes a pointer part for storing a pointer which indicates an address of the connected list in the dictionary 230, an identification information part for storing identification information corresponding to two candidate elements, and a flag part for storing a flag which indicates the number of identification information stored in the identification information part. In addition, the index part 231 simultaneously outputs the data of each of the parts of the corresponding storage region to the bus 206 depending on a read instruction which specifies the reference number.

The corresponding reference numbers $\omega_1$ and $\omega_2$ and the last characters $K_1$ and $K_2$ of the two candidate elements are stored, as the identification information of the candidate elements, in the identification information part of the storage region corresponding to the reference number ω. For example, as shown in FIG.10, the identification information storage part is formed from two reference number parts R1 and R2 and two character parts C1 and C2, and the reference numbers $\omega_1$ and $\omega_2$ are stored in the two reference number parts R1 and R2 while the characters $K_1$ and $K_2$ are stored in the two character parts C1 and C2. One of the two candidate elements described above will hereinafter be referred to as a first candidate element, and the other will be referred to as a second candidate element.

When only the identification information corresponding to the first candidate element is stored in the identification information part, the flag is set to a logic value "1" and the flag is otherwise reset to a logic value "0".

On the other hand, the list part 232 is formed from a plurality of lists, and each list includes parts similarly as in the case of each region of the index part 231. In other words, each list includes a pointer part, an identification information part and a flag part. In addition, the list part 232 simultaneously outputs the data of each of the parts of the specified list to the bus 206 depending on the read instruction.

The pointer part of each list of the list part 232 stores a pointer which indicates the address of another list in the dictionary 230, which other list is connected to the corresponding list. Further, the identification information part of the list of the list part 232 includes two reference number parts and two character parts, and the reference numbers corresponding to the two candidate elements and the last characters thereof are respectively stored in the reference number parts and the character parts, similarly as in the case of the identification information part of the index part 231. For example, in the list which is connected to the storage region corresponding to the reference number ω of the index part 231, a reference number $\omega_3$ and a character $K_3$ are stored as the identification information of the first candidate element, and a reference number $\omega_4$ and a character $K_4$ are stored as the identification information of the second candidate element.

An initial value "0" is set in each region of the index part 231 and the list part 232 before the coding process starts.

The dictionary retrieval circuit 240 includes the candidate element holding part 341 for holding information related to the candidate element read from the dictionary 230, the match detecting part 342 for detecting from the input candidate elements the element which having a last character which matches the extension character K, the NOR circuit 343, and the timing control circuit 344 for controlling the operation timings of each of the parts of the dictionary retrieval circuit 240.

The data output from the index part 231 and the list part 232 of the dictionary 230 are input to the candidate element holding part 341 via the bus 206. The candidate element holding part 341 includes two address registers 351a and 351b, two candidate character registers 352a and 352b, two reference number registers 353a and 353b, and a flag register 354.

Out of the data input via the bus 206, the pointer part is input to the address register 351a and the flag part is input to the flag register 354. In addition, the reference number and the character of the first candidate element in the identification information part are respectively input to the reference number register 353a and the candidate character register 352a. On the other hand, the reference number and the character of the second candidate element in the identification information part are respectively input to the reference number register 353b and the candidate character register 352b.

The registers of the candidate element holding part 341 store the incoming data in response to a load signal which is received from the timing control circuit 344.

An output of the address register 351a is input to the address register 351b and the NOR circuit 343, and is also input to the dictionary 230 as a read address.

The match detecting part 342 includes an extension character register 361 for storing the extension character K, and two comparator circuits 362a and 362b. The comparator circuits 362a and 362b respectively compare the extension character K which is stored in the extension character register 361 with the 30 respective candidate characters which are stored in the two candidate character registers 352a and 352b. The comparator circuits 362a and 362b each output a logic signal "1" when the two compared characters match.

The match detecting part 342 receives the flag which is stored in the flag register 354 of the candidate element holding part 341. The match detecting part 342 decides whether or not the corresponding partial string is detected, based on the flag and the results of the comparisons made in the two comparator circuits 362a and 362b. The result of this decision made in the match detecting part 342 is notified to the MPU 201.

For example, when the logic value "0" is set in the flag register 354, the match detecting part 342 outputs the comparison results of the comparator circuits 362a and 362b as they are. On the other hand, when the logic value "1" is set in the flag register 354, the match detecting part 342 regards the comparison result of the comparator circuit 352b invalid, and resets the output of the comparator circuit 352b to "0" before outputting the same.

The output of the address register 351a is input to the NOR circuit 343, and an output of this NOR circuit 343 is input to the MPU 201.

The timing control circuit 344 outputs a read signal which instructs with respect to the dictionary 230 the output of the data which is stored in the storage region specified by the read address. The timing control circuit 344 also outputs a load signal to control the timings with which the data are stored in each of the registers within the candidate element holding part 341.

Next, a description will be given of the retrieval operation of the dictionary retrieval circuit 240 for making a retrieval from the dictionary 230.

First, the MPU 201 inputs one character which is newly input via the input port part 202 to the extension character register 361 of the dictionary retrieval circuit 240. In addition, the MPU 201 inputs the reference number ω of the observed character string to the address register 351a, and instructs the start of a retrieval operation in which a partial string described by the reference number ω and the extension character K is retrieved from the dictionary 230.

For example, a reference number ("1", for example) which is assigned to a character "a" is obtained as a hashing address corresponding to the first character "a" of the input character string shown in FIG. 1A, and this hashing address is input to the address register 351a. In addition, the next character "b" is read, and this character "b" is input to the extension character register 361 as the extension character K. Then, the MPU 201 instructs the start of the retrieval operation to the timing control circuit 344 of the dictionary retrieval circuit 240.

The timing control circuit 344 inputs a read signal to the dictionary 230 in response to the retrieval start instruction described above. As a result, a reading process is started using the reference number stored in the address register 351a as the read address of the dictionary 230, and the data stored in the corresponding storage region of the index part 231 is input to the dictionary retrieval circuit 240 via the bus 206.

The timing control circuit 344 inputs a load signal to each of the registers within the candidate element holding part 341 after a predetermined time (read cycle time) τ elapses from the time when the read signal is output. This predetermined time τ is the time required to carry out the reading process in which the data is read from the dictionary 230.

Accordingly, the pointer which is read from the pointer part of the corresponding storage region of the index part 231 is stored in the address register 351a, and this pointer becomes the next read address. In addition, the pointer used for the immediately preceding reading process is stored in the address register 351b.

Thereafter, the timing control circuit 344 outputs the read signal unless otherwise instructed from the MPU 201. Then, the timing control circuit 344 outputs the load signal after the read cycle time τ. This operation of the timing control circuit 344 is repeated.

The reading process in which the candidate elements are read from the dictionary 230 is carried out for every read cycle time τ, and the candidate elements are successively read first from the index part 231 and next from the list part 232.

The match detecting part 342 operates independently of the candidate element holding part 341. For this reason, the comparator circuits 352a and 362b of the match detecting part 342 respectively compare the extension character K with the respective characters which are previously read and stored in the candidate character registers 352a and 352b, in parallel with the reading process described above.

As described above, the match detecting part 342 outputs as the match detection result the outputs of the comparator circuits 362a and 362b depending on the flag which is stored in the flag register 354. Hence, the MPU 201 carries out an interrupt process which will be described hereafter when the match detection result received from the comparator circuit 362a or 362b has the logic value "1".

For example, when the match detection result from the comparator circuit 362b has the logic value "1", the MPU 201 decides that the character string to be coded matches the second candidate element which is indicated by the reference number stored in the reference number register 353b. In this case, the MPU 201 reads the corresponding reference number from the reference number register 353b and inputs this reference number to the address register 351a. In addition, the MPU 201 reads the next character of the input character string and inputs this character to the extension character register 361 as the new extension character K.

Thereafter, the MPU 201 instructs the start of the retrieval operation to the dictionary retrieval circuit 240.

When the extension character K is described by a bit pattern which is identical to the initial value "0", for example, at least one of the comparator circuits 362a and 362b may output the logic signal "1" which indicates the match even when no corresponding element is registered in the dictionary 230. However, when the flag indicates that only the first candidate element is stored, the match detection result related to the second candidate element is made invalid, and the output logic signal of the comparator circuit 362b is reset to "0" before being output. Hence, it is possible to prevent an undefined element from being retrieved erroneously. In addition, when the first candidate element is also undefined, the output logic signals of the two comparator circuits 362a and 362b both become "1". In this case, the MPU 201 decides whether or not both the match detection results are "1" at the beginning of the interrupt process described above, for example, and the MPU 201 can recognize that no corresponding partial string was detected when both the match detection results are "1".

Similarly as in the case of the match detecting part 342, the NOR circuit 343 operates independently of the candidate element holding part 341. Thus, the NOR circuit 343 decide whether or not a connected list exists in parallel with the reading process, by deciding whether or not a valid pointer other than the initial value "0" is stored in the address register 351a.

Therefore, when the NOR circuit 343 outputs a logic signal "1" and it is decided that no connected list exists, the MPU 201 instructs the dictionary retrieval circuit 240 to discontinue the retrieval operation, and carries out the following interrupt process.

First, the MPU 201 outputs as the code the reference number ω corresponding to the last retrieved partial string. Next, the MPU 201 reads the data stored in the address register 351 and the flag register 354, and carries out a registration process for the new partial string depending on the flag which is stored in the flag register 354.

For example, the MPU 201 decides that no candidate element is stored in the storage region of the dictionary 230 indicated by the address which is stored in the address register 351 when the above described flag has the logic value "0". In this case, the MPU 201 assigns a new reference number $\omega_n$ to the partial string which is obtained by adding the extension character K to the reference number ω. Furthermore, the MPU 201 stores the reference number $\omega_n$ and the extension character K as the identification information of the first candidate element into the identification information part of the storage region of the dictionary 230 indicated by the above described address.

On the other hand, when the flag has the logic value "1", the MPU 201 decides that only the first candidate element is stored in the storage region of the dictionary 230 indicated by the above described address. Hence, in this case, the MPU 201 stores the reference number $\omega_n$ and the extension character K as the second candidate element into the identification information part of the corresponding storage region. In addition, an address of an unused region of the list part 232 is stored as a pointer into the pointer part of the corresponding storage region.

Thereafter, the coding operation is continued by taking the extension character K as the head part of the observed character string and taking the next character of the input character string as the new extension character K.

As described above, the pointer which indicates the connected list and the identification information of the two candidate elements are stored in the respective storage regions of the index part 231 and the list part 232 of the dictionary 230. In addition, in the match detecting part 342 of the dictionary retrieval circuit 230, the two comparator circuits 362a and 362b makes the match detection of the two candidate elements with respect to the observed character string.

Therefore, it is possible to simultaneously read two candidate elements from the dictionary 230 in one reading process, and make the match detection of the two candidate elements with respect to the observed character string.

Furthermore, the lists are successively searched by supplying the read signal from the timing control circuit 344 to the dictionary 230 for every read cycle time τ, and by supplying the read pointer to the dictionary 230 as the next read address. Moreover, the match detecting process and the connection deciding process are carried out in parallel with the reading process, by independently operating the match detecting part 342 and the NO circuit 343.

Accordingly, it is possible to search for the connected lists without requiring the control of the MPU 201, and the reading process can be carried out with the match detecting process and the connection deciding process in the form of a pipeline process. In this case, the reading process with respect to the two candidate elements and the match detecting process can be carried out in the read cycle time τ described above. Hence, unlike the conventional method which requires the control of the MPU for all processes, it is possible to considerably reduce the time which is required to search for the connected lists.

It is therefore possible to retrieve the character strings from the dictionary 230 at a high speed using the simple circuit shown in FIG.9. For this reason, it is possible to reduce the time required to carry out the retrieval process with respect to the dictionary 230, carry out the coding process at a high speed, make the coding speed approximately the same as the data transfer speed to the magnetic disk unit or the like, and transfer the coded data to the magnetic disk unit or the like in real time.

As shown in FIG.9, the dictionary retrieval circuit 240 has a simple circuit construction and will not greatly increase the hardware of the data compression system. In addition, the MPU 201 simply needs to carry out the interrupt process described above depending on the outputs of the match detecting part 342 and the NOR circuit 343, and does not need to operate at a particularly high speed.

The description given above refers to the case where this embodiment is applied to the data compression system. However, this embodiment, that is, the present invention, is applicable to any system which uses the open hashing method to retrieve information from a dictionary which has a tree structure.

Moreover, the number of candidate elements stored in each storage region of the index part 231 and the list part 232 of the dictionary 230 is not limited to that of the embodiment, and it is of course possible to store three or more candidate elements. In this case, the identification information part is formed by providing a number of reference number parts and a number of character parts which numbers respectively correspond to the number of the candidate elements stored. In addition, a binary number which indicates the number of candidate elements stored may be used as the flag.

Further, the present invention is not limited to these embodiments, but various variations and modifications may be made without departing from the scope of the present invention.

What is claimed is:

1. A dictionary searching system for retrieving a character string which is described by input reference number and characters from a plurality of mutually different character strings which are registered in a dictionary in correspondence with reference numbers assigned to the character strings, said dictionary searching system comprising:
   a dictionary including an index part and a list part, said index part storing in correspondence with the reference numbers a reference number which is assigned to one of character strings which are obtained by adding a character to the character string which is assigned the input reference number and the character which is added to the one cf the character strings, said list part storing in correspondence with the reference numbers a reference number which is assigned to one of character strings having a last character which differs from that of the character string which is assigned the input reference number and the character which is added to the one of the character strings;
   reading means, coupled to said dictionary, for initially reading information from the index part by specifying the input reference number and thereafter reading information from the list part by specifying the reference number which is read from said dictionary;

detecting means, coupled to said dictionary, for detecting each character which matches the input characters out of characters read from said dictionary and for outputting a result of this detection as a retrieval result; and deciding means, coupled to said dictionary, for deciding whether or not a reference number is included in an output of said dictionary and for outputting a result of this detection as a retrieval result, said reading means, said detecting means and said deciding means operating independently of each other.

2. The dictionary searching system as claimed in claim 1, wherein said reading means carries out a reading process in which information from said dictionary at predetermined time intervals, and said detecting means and said deciding means respectively carry out detecting and deciding processes in parallel with the reading process of said reading means.

3. The dictionary searching system as claimed in claim 2, wherein the processes of said reading means, said detecting means and said deciding means are carried out in a form of pipeline processing.

4. The dictionary searching system as claimed in claim 1, wherein the retrieval result output from said detecting means indicates that a character string corresponding to the input character string is found in said dictionary when the characters read from said dictionary match the input characters.

5. The dictionary searching system as claimed in claim 1, wherein the retrieval result output from said deciding means indicates that no character string corresponding to the input character string is registered in said dictionary when at least one of the index part and the list part stores no reference number corresponding to the input reference number.

6. A dictionary searching system for retrieving a character string which is described by input reference number and characters from a plurality of mutually different character strings which are registered in a ditionary in correspondence with reference numbers assigned to the character strings, said dictionary searching system comprising:

a dictionary including an index part and a list part, said index part storing in correspondence with the reference numbers identification information corresponding to one of candidate character strings which are obtained by adding a character to the character string which is assigned the input reference number and pointers which indicate storage locations of other candidate character strings, said list part storing in correspondence with the reference numbers identification information corresponding to one of candidate character strings having a last character which differs from that of the character string which is assigned the input reference number and pointers which indicate storage locations of other candidate character strings;

reading means, coupled to said dictionary, for initially reading the pointer and identification information from the index part based on the input reference number and thereafter reading the pointer and identification information from the list part by specifying the list part by the pointer which is read from said dictionary;

detecting means, coupled to said dictionary, including comparator means for comparing each identification information read from said dictionary with the input characters, for detecting each character which matches the input characters out of the candidate character string read from said dictionary and for outputting a result of this detection as a retrieval result; and deciding means, coupled to said dictionary, for deciding whether or not an unread candidate character string exists in said dictionary based on the pointer read from said dictionary and for outputting a result of this detection as a retrieval result, said reading means, said detecting means and said deciding means operating independently of each other.

7. The dictionary searching system as claimed in claim 6, wherein said reading means carries out a reading process in which information from said dictionary at predetermined time intervals, and said detecting means and said deciding means respectively carry out detecting and deciding processes in parallel with the reading process of said reading means.

8. The dictionary searching system as claimed in claim 7, wherein the processes of said reading means, said detecting means and said deciding means are carried out in a form of pipeline processing.

9. The dictionary searching system as claimed in claim 6, wherein the identification information includes the reference number of the candidate character string and the last character of the candidate character string.

10. The dictionary searching system as claimed in claim 6, wherein said list part includes a plurality of lists respectively storing at least one candidate character string, and said comparator means includes a plurality of comparators for simultaneously making the match detection for each of the candidate character strings read from the lists.

11. The dictionary searching system as claimed in claim 10, wherein the lists of the list part within said dictionary respectively correspond to lists used by an open hashing method.

* * * * *

UNITED STATES PATENT AND TRADEMARK OFFICE
CERTIFICATE OF CORRECTION

PATENT NO. : 5,136,289
DATED : August 4, 1992
INVENTOR(S) : Shigeru YOSHIDA et al.

It is certified that error appears in the above-identified patent and that said Letters Patent is hereby corrected as shown below:

Col. 4,  line 38, change "S705" to --705--;
         line 60, change ""Index[i]"" to --"Index[$\omega$]"--;
         line 64, before "to" insert --i--.

Col. 5,  line 57, after "one of" insert --the--.

Col. 6,  line 26, change "ditionary" to --dictionary--.

Col. 9,  line 55, change "through $2N_{max}$"" to --through "$2N_{max}$"--.

Col. 12, line 42, change "to to" to --to--.

Col. 18, line 58, delete "30".

Col. 20, line 62, change "decide" to --decides--.

Col. 22, line 47, after "by" insert --an--;
         line 56, after "of" insert --said--;
         line 62, after "of" insert --the--.

Col. 23, line 7, after "of" insert --the--;
         line 19, after "information" insert --is read--;
         line 42, after "by" insert --an--;
         line 45, change "ditionary" to --dictionary--;
         line 51, after "of" insert --the--.

UNITED STATES PATENT AND TRADEMARK OFFICE
CERTIFICATE OF CORRECTION

PATENT NO. : 5,136,289
DATED : August 4, 1992
INVENTOR(S) : Shigeru YOSHIDA et al.

It is certified that error appears in the above-identified patent and that said Letters Patent is hereby corrected as shown below:

Col. 24, line 2, after "of" insert --the--;
line 32, after "information" insert --is read--.

Signed and Sealed this

Eighth Day of March, 1994

Attest:

BRUCE LEHMAN

Attesting Officer     Commissioner of Patents and Trademarks